United States Patent
May

(10) Patent No.: US 6,567,433 B2
(45) Date of Patent: May 20, 2003

(54) SYSTEM AND METHOD FOR DETERMINING TRANSMISSION WAVELENGTHS FOR LASERS IN A DENSE WAVELENGTH DIVISION MULTIPLEXER

(75) Inventor: Randy Dean May, Montrose, CA (US)

(73) Assignee: Tunable Photonics Corporation, Altadena, CA (US)

( * ) Notice: Subject to any disclaimer, the term of this patent is extended or adjusted under 35 U.S.C. 154(b) by 207 days.

(21) Appl. No.: 09/811,090

(22) Filed: Mar. 17, 2001

(65) Prior Publication Data

US 2002/0044575 A1 Apr. 18, 2002

Related U.S. Application Data

(63) Continuation-in-part of application No. 09/685,212, filed on Oct. 10, 2000.

(51) Int. Cl.[7] .................................................. H01S 3/10
(52) U.S. Cl. .......................... 372/20; 372/19; 372/98; 372/32
(58) Field of Search ............................. 372/20, 19, 98, 372/32

(56) References Cited

U.S. PATENT DOCUMENTS

| 4,468,773 | A | * | 8/1984 | Seaton | 372/20 |
| 4,689,794 | A | * | 8/1987 | Brosnan | 372/20 |
| 4,737,798 | A | | 4/1988 | Lonis | |
| 4,815,081 | A | | 3/1989 | Mahlein | |
| 4,821,273 | A | | 4/1989 | Hori | |
| 4,913,525 | A | | 4/1990 | Asakura | |
| 4,955,027 | A | | 9/1990 | Piper | |
| 4,955,029 | A | | 9/1990 | Leroy | |
| 4,982,406 | A | * | 1/1991 | Facklam | 372/32 |
| 5,042,042 | A | | 8/1991 | Hori | |
| 5,068,804 | A | | 11/1991 | Javan | |
| 5,208,819 | A | | 5/1993 | Huber | |
| 5,287,367 | A | | 2/1994 | Yanagawa | |
| 5,299,212 | A | | 3/1994 | Koch | |
| 5,313,480 | A | | 5/1994 | Fidric | |
| 5,323,409 | A | | 6/1994 | Laskoskie | |
| 5,428,700 | A | | 6/1995 | Hall | |
| 5,509,022 | A | * | 4/1996 | Lowery et al. | 372/32 |
| 5,544,183 | A | | 8/1996 | Takeda | |
| 5,577,059 | A | | 11/1996 | Lee | |
| 5,627,648 | A | * | 5/1997 | Garrett | 356/416 |
| 5,633,883 | A | * | 5/1997 | Shi et al. | 372/20 |
| 5,691,989 | A | | 11/1997 | Rakuljic | |
| 5,706,301 | A | * | 1/1998 | Lagerstroem | 372/32 |
| 5,780,843 | A | | 7/1998 | Cliche | |

(List continued on next page.)

OTHER PUBLICATIONS

Yvonne Carts–Powell, Silicon FP interferometer provides tuning and Filtering for DWDM, WDM Solutions, Jun. 2, 2001.

(List continued on next page.)

Primary Examiner—Leon Scott, Jr.
(74) Attorney, Agent, or Firm—Welsh & Katz, Ltd.

(57) ABSTRACT

A system and method is provided to calibrate a transmission laser, such as a widely tunable laser (WTL), within a dense wavelength division multiplexer (DWDM) for transmission through an optic fiber. The WTL is tuned to the ITU grid using an etalon and a gas cell. The absolute transmission wavelengths of the WTL are calibrated by routing a WTL output beam through the etalon and through the gas cell while varying tuning parameters of the WTL to generate an etalon spectrum and a gas absorption spectrum, both as functions of the tuning parameters. The etalon and gas absorption spectra are compared, along with input reference information specifying gas absorption as a function of absolute wavelength, to determine the absolute transmission wavelength for the WTL as a function of the tuning parameters. The WTL is then tuned to align the transmission wavelength of the WTL to an ITU transmission grid line.

2 Claims, 11 Drawing Sheets

U.S. PATENT DOCUMENTS

| | | | |
|---|---|---|---|
| 5,781,572 A | | 7/1998 | Tahara |
| 5,798,859 A | * | 8/1998 | Colboune et al. ............. 372/32 |
| 5,825,792 A | | 10/1998 | Vilieneuve |
| 5,867,513 A | | 2/1999 | Sato |
| 5,915,052 A | | 6/1999 | Ball |
| 6,078,418 A | * | 6/2000 | Hansen et al. ................ 385/37 |
| 6,088,142 A | | 7/2000 | Cao |
| 6,101,200 A | * | 8/2000 | Burbidge et al. ............. 372/20 |
| 6,122,301 A | * | 9/2000 | Tei et al. ...................... 372/20 |
| 6,125,128 A | * | 9/2000 | Mizrahi ........................ 372/20 |
| 6,134,253 A | * | 10/2000 | Munks et al. ................. 372/32 |
| 6,151,340 A | | 11/2000 | Rivers |
| 6,181,717 B1 | | 1/2001 | Kner |
| 6,222,861 B1 | | 4/2001 | Kuo |
| 6,240,109 B1 | | 5/2001 | Shieh |

OTHER PUBLICATIONS

T. Niemi et al., Wavelength monitoring of multi–channel DWDM–systems using a single temperature–tunable Fabry–Perot filter, Unknown.

Don G. Peterson & Amnon Yariv, Interferometry and Laser Control with solid Fabry–Perot Etalons, Applied Optics, Jun. 1966, vol. 5, No. 6.

Tapio Niemi et al., Tunable Silicon Etalon for Simultaneous Spectral Filtering and Wavelength . . . IEEE Photonics Technology Letters, Jan. 2001, vol. 13, No. 1.

Tatsuno et al., 50 GHz Spacing, Multi–Wavelength Tunable Locker . . . , Unknown.

Randy D. May, The Optogalvanic Effect, University of North Carolina, 1985. Appendix A, USA.

Randy D. May, Correlation–based technique for automated tunable diode laser scan stabilization, Rev. Sci. Instrum—vol. 63 (5) , 2922–2926 May 1992, USA.

* cited by examiner

SYSTEM AND METHOD FOR DETERMINING TRANSMISSION WAVELENGTHS FOR LASERS IN A DENSE WAVELENGTH DIVISION MULTIPLEXER

RELATED APPLICATIONS

This patent application is a Continuation-in-Part of U.S. patent application Ser. No. 09/685,212, of Randy May entitled "Method And Apparatus For Determining Transmission Wavelengths For Lasers In A Dense Wavelength Division Multiplexer", filed Oct. 10, 2000.

BACKGROUND OF THE INVENTION

1. Field of the Invention

The invention generally relates to dense wavelength division multiplexers (DWDM) and in particular to a technique for determining transmission wavelengths of lasers of the DWDM as a function of laser control tuning parameters.

2. Description of the Related Art

A DWDM is a device for simultaneously transmitting a set of discrete information channels over a single fiber optic transmission line. A conventional fiber optic transmission line is capable of reliably transmitting signals within a bandwidth of 1280 to 1625 nanometers (nm), the "low loss" region for silica fiber. Within that overall bandwidth, the International Telecommunications Union (ITU) has defined various transmission bands and specified certain transmission channel protocols for use within each transmission band. One example of a transmission band is the ITU "C" band, which extends 40 nm from 1525 nm to 1565 nm. Within the C band, specific transmission channel protocols of 40, 80, or 160 discrete channels are defined and, for each protocol, the ITU has defined a grid of transmission wavelengths, with each line corresponding to an acceptable transmission wavelength. For the 40 channel protocol, the corresponding ITU grid has 40 lines with channel spacing of 0.8 nm; for the 80 channel protocol, the corresponding ITU grid has 80 lines with channel spacing of 0.4 nm; and so forth. The protocols have been defined to ensure that all DWDM transmission and reception equipment are fabricated to operate at the same wavelengths. Other exemplary ITU transmission bands are the S- and L-bands.

To simultaneously transmit the set of channels on a fiber optic cable, the DWDM employs a set of individual distributed feedback (DFB) lasers, with one DFB laser per channel. FIG. 1 illustrates a DWDM 100 having forty individual DFB lasers 102 for transmitting optical signals via a single optic fiber 104. An optical multiplexer 106 couples signals received from the individual DFBs via a set of intermediate optic fibers 107 into output optic fiber 104. Each DFB laser transmits at a different wavelength of the forty channel ITU C band. This enables forty separate channels of information to be transmitted via the single optical fiber 104 to a de-multiplexer (not shown) provided at the far end of the optical fiber.

To permit the DWDM to transmit forty separate channels simultaneously, each individual DFB must be tuned to a single ITU transmission channel wavelength. A DFB laser can be tuned only within a narrow wavelength band, typically about 4 nm in width. Hence, for the 40 channel protocol of the ITU C band having 0.8 nm transmission line spacing, the typical DFB can only be tuned to one of a few adjacent lines out of the total of 40 lines of the ITU grid. Traditionally, each individual DFB laser is manually calibrated at the factory to emit at one of the corresponding ITU transmission lines. This calibration is achieved by adjusting the laser operating temperature and current to obtain the desired wavelength. The laser is then, in some implementations, locked to the target wavelength by routing the output beam from each DFB laser through a corresponding manually-tunable etalon. (The etalons are not shown in FIG. 1.) A manually-tunable etalon is an optical device which produces a periodically-varying transmission spectrum as a function of laser wavelength. By tilting the etalon relative to the DFB laser beam path, a transmission peak of the etalon can be made coincident with the target ITU channel. The wavelength of an etalon transmission peak is calibrated to one of the ITU transmission lines by manually adjusting the angle of the etalon while monitoring the wavelength output from the etalon using an optical wavelength analyzer. The angle of the etalon is adjusted until the output wavelength is properly aligned with one of the ITU transmission lines, then the etalon is mounted in place in an attempt to lock the output wavelength of etalon to the selected ITU transmission line. This is a difficult and time consuming process requiring skilled technicians. Calibration of all forty DFB lasers of a single DWDM can be quite expensive. Mechanical or thermal drift of the etalon over time often moves the transmission peak away from the target ITU channel which requires recalibration.

Once the DFB lasers of a single DWDM are properly aligned with the ITU grid, the DWDM may then be used for transmitting signals over a fiber optic line, such as for transmitting digital data over computer networks (i.e., the Internet) or for transmitting television signals from a television network to one of its affiliates. A single DWDM must be provided for use with each fiber optic line employed for DWDM transmissions and hence a single customer installation, such as a television broadcast center, may require many, many DWDMs. If one of the DFB lasers within a DWDM drifts from its corresponding ITU transmission line or otherwise malfunctions, the entire DWDM typically needs to be replaced requiring the malfunctioning DWDM to be returned to the factory to be re-calibrated or otherwise fixed. As a result, the cost of maintaining a set of DWDMs is often substantial. To help remedy this problem, some DWDMs are provided with an additional widely tunable laser (WTL) which can be tuned separately to any one of the ITU grid lines. Hence, if one of the DFB lasers malfunctions, the single WTL can be tuned to the corresponding transmission wavelength of the DFB to thereby permit the DWDM to continue to operate. Additional WTLs can be supplied with a DWDM to accommodate the failure of two or more DFB channels, and such "sparing" is a major advantage a WTL over a DFB. However, the WTL cannot simply and accurately be tuned to any target ITU channel at a customer installation and must be calibrated at the factory for operation at a specific channel.

Another problem associated with employing DFB lasers within DWDMs is that, because each DFB laser can only be tuned within a narrow range of about 4 nm, each DFB laser can only be calibrated to one of a few adjacent ITU transmission wavelength lines. It may also sometimes be desirable to configure the DWDM to use many lasers for transmitting at a single ITU transmission line to provide more bandwidth on that channel. When using DFB lasers, no more than two or three of the lasers can be calibrated to a single ITU transmission line. Hence, in some DWDMs, WTLs are used exclusively instead of DFB lasers, thus permitting any of the lasers to be manually calibrated at the customers installation to transmit on any of the ITU transmission lines. Although the use of WTLs remedies many of the problems associated with using DFB lasers, WTLs are difficult and expensive to fabricate and initially calibrate, and are susceptible to wavelength drift requiring frequent recalibration at the customers installation by trained technicians and hence necessitating high overall installation and maintenance costs.

Thus, whether using DFB lasers or WTLs within a DWDM, significant problems arise in achieving and maintaining proper wavelength calibration of the lasers to permit reliable operation of the DWDM. Accordingly it would be desirable to provide an efficient method and apparatus for calibrating transmission lasers within a DWDM and it is to that end that the invention is primarily directed.

SUMMARY OF THE INVENTION

In accordance with a first aspect of the invention, a method and apparatus is provided for calibrating a laser using an etalon and a gas absorption cell containing a gas of known light absorption characteristics. In accordance with the method, an output beam from the laser is routed through the etalon while the laser is tuned through a range of tuning parameters to produce an etalon transmission spectrum as a function of the laser tuning parameters. The output beam from the laser is also routed through the gas cell while the laser is tuned through the range of tuning parameters to produce a gas absorption spectrum as a function of the laser tuning parameters. The etalon transmission spectrum and the gas absorption spectrum are detected and then compared to determine the absolute transmission wavelength of the laser as a function of the laser tuning parameters. Thereafter, the laser can be set to transmit at a selected transmission wavelength by using the tuning parameters that correspond to the selected wavelength.

In an exemplary embodiment, the invention is implemented as a hand-held wavelength mapper for use with a transmission WTL of a DWDM to be tuned to an ITU transmission grid line for transmission through an optic fiber. The laser is tuned using a single tuning parameter, which may be an input voltage or current. The known gas, which may be hydrogen cyanide, acetylene or carbon dioxide, is contained within a sealed gas cell of the wavelength mapper. A portion of the output beam of the laser is split off and routed separately through the etalon and the gas absorption cell to two separate detectors for detecting both an etalon transmission spectrum and a gas absorption spectrum.

The absolute transmission wavelengths of the WTL as a function of the input voltage or current WTL tuning parameters are determined as follows. The detected etalon transmission spectrum has transmission peaks that are separated by a precisely known wavenumber (wavenumber is the number of wavelengths of laser light per cm, and so is inversely proportional to wavelength) determined by the construction material, physical dimension, and optical properties of the etalon. This wavenumber "comb" is exploited to determine relative wavenumbers for the tuning parameters. To this end, transmission lines in the detected etalon transmission spectrum are identified, a relative wavenumber is assigned to the tuning parameter corresponding to each consecutive etalon transmission line, and then relative wavenumbers are assigned to each intermediate value of the tuning parameters by interpolating between the transmission lines. Next, the detected gas absorption spectrum, which is a function of WTL tuning parameters, is converted to a modified gas absorption spectrum, which is a function of relative wavenumber, by assigning relative wavenumbers to each value of the detected gas absorption spectrum based on the associated tuning parameter. Then, the modified gas absorption spectrum is compared with an input gas absorption spectrum, which is a function of absolute wavenumber, to determine corresponding absolute wavenumbers for each value of the tuning parameters. This is achieved by inputting a predetermined gas absorption spectrum specifying absorption as a function of absolute wavenumber; correlating the modified gas absorption spectrum, which is a function of relative wavenumber, with the input absorption spectrum, which is a function of absolute wavenumber, to determine an offset between relative wavenumbers and the absolute wavenumbers; and then adjusting the relative wavenumbers associated with each value of the tuning parameters by the offset value to provide an absolute wavenumber for each value of the tuning parameters. If needed, the wavenumbers can be easily converted to wavelengths or frequencies. In this manner, the absolute transmission wavelength, frequency, or wavenumber of the WTL is thereby determined as a function of the tuning parameters.

Hence, by tuning the output wavelength of the WTL and using an etalon in combination with a gas absorption cell, the WTL can be quickly, easily and precisely set to a selected ITU transmission grid line at a customers installation. The tuning process can be periodically repeated to maintain precise tuning of the WTL despite possible temperature or mechanical drift. Thus overall installation and maintenance costs associated with DWDMs can be significantly reduced. By providing precise and reliable tuning of the lasers of the DWDM, the invention also facilitates the use of a greater number of transmission channels, such as 80, 160 channels, or more.

In general, any laser tunable using any set of input tuning parameters, such as various combinations of input analog or digital signals, can be used with the invention so long as an appropriate gas absorption reference is available. The laser is simply scanned through its full range of tuning parameters to enable determination of the absolute output wavelength of the laser as a function of any combination of the tuning parameters.

In an alternative embodiment, particularly for use with lasers employing two or more tuning parameters, a wavelength mapping technique is provided using a pair of etalons—one comparatively thick and one comparatively thin. The thin etalon is employed to produce a fairly coarse relative wavelength map covering an entire transmission band of interest, such as the entire ITU C-Band. The thick etalon is then employed in combination with a gas absorption cell to more finely map the wavelengths of the laser to its tuning parameters. Initially, an output beam from the laser is routed through the thin etalon while tuning the laser through a range of a first tuning parameter to produce a first coarse etalon transmission spectrum, which is a function of the first laser tuning parameter. Next, the output beam from the laser is again routed through the first etalon while tuning the laser through a range of a second tuning parameter to produce a second coarse etalon transmission spectrum, which is a function of the second laser tuning parameter. The two coarse etalon transmission spectra are combined to produce a two-dimensional map of relative wavelengths as a function of the tuning parameters. A microcontroller processes the two-dimensional map to determine combinations of tuning parameters for use in tuning the laser from a minimum output wavelength to a maximum output wavelength. The microcontroller then controls the laser to sweep from the minimum wavelength to the maximum wavelength while routing the output laser beam through the thick etalon and through a gas absorption cell. Using techniques described above, the microcontroller compares the resulting gas absorption spectrum and etalon transmission spectrum with a reference gas absorption spectrum to map the laser tuning parameters to absolute transmission wavelengths of the laser. In this manner, wavelength mapping is achieved for use with lasers requiring multiple tuning parameters in circumstances where a single etalon might not cover the entire transmission band of interest with sufficient precision.

In accordance with a second aspect of the invention, a method and apparatus is provided for locking a laser to a transmission wavelength using an etalon and a gas absorption cell. The etalon used to map the output wavelengths of the laser is a temperature-controlled etalon. The aforementioned wavelength mapping steps are performed to determine the absolute wavelength of the laser as a function of the laser tuning parameters. Tuning parameters are applied to the laser to tune the laser to a selected transmission wavelength, such as an ITU channel wavelength. Additionally, a temperature offset is applied to the etalon to vary the wavelengths of the transmission peaks of the etalon until one of the transmission peaks is precisely aligned with the selected wavelength. Any drift of the laser output from the selected wavelength is detected and the tuning parameters applied to the laser are automatically adjusted to compensate for the drift. Thus, a feedback loop is provided which keeps the main output beam locked on a selected transmission channel despite possible variations in the output characteristics of the laser. In an exemplary embodiment, the invention is implemented as a wavelength locker for mounting to a transmission WTL of a DWDM to be tuned to an ITU transmission grid line for transmission through an optic fiber. In one specific implementation, the temperature offset is applied to the etalon by applying an electrical current to the etalon.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION OF THE EXEMPLARY EMBODIMENTS

With reference to the remaining figures, exemplary embodiments of the invention will now be described.

Figure 1:
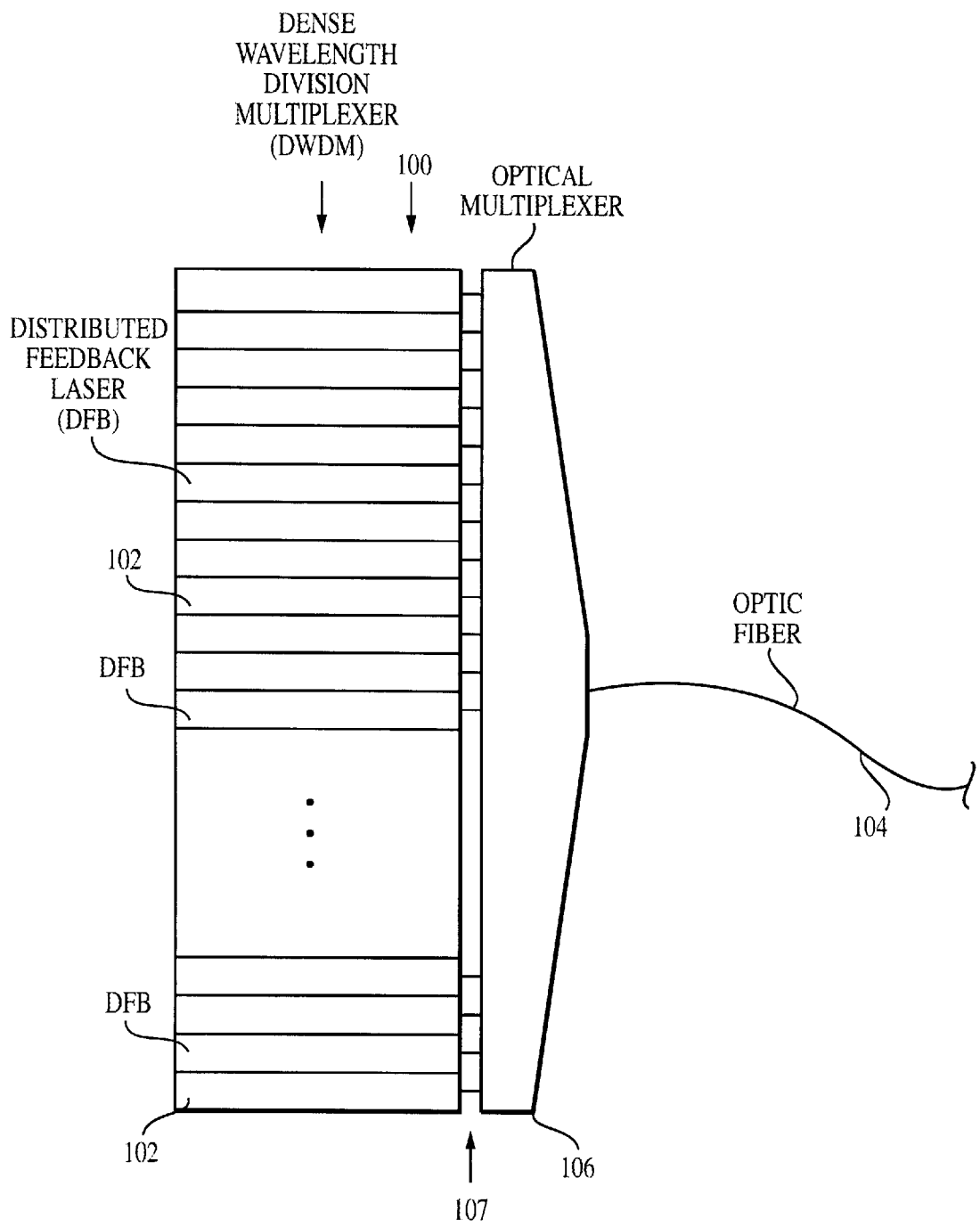
FIG. 1 illustrates a DWDM configured in accordance with the prior art.
Figure 2:
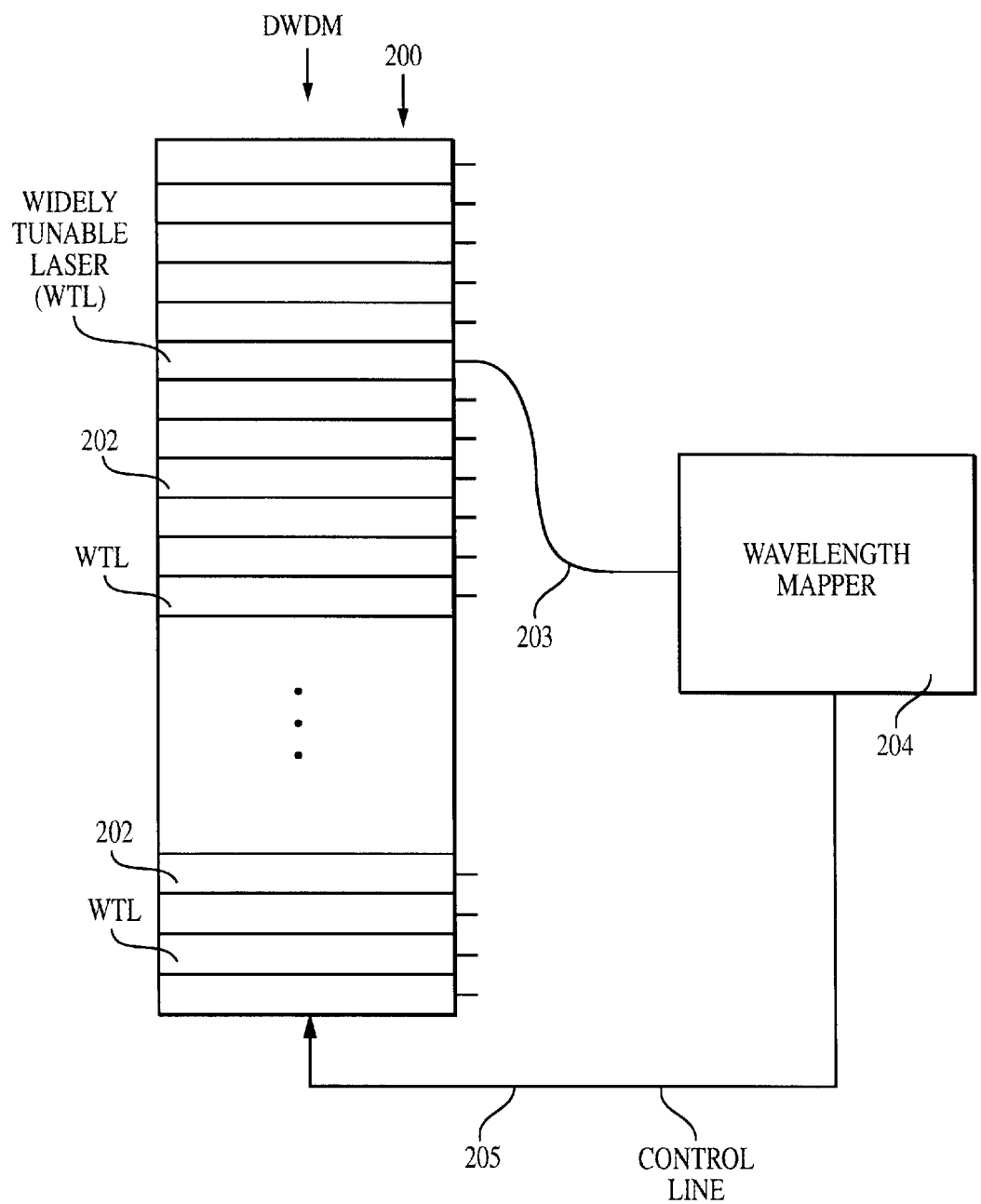
FIG. 2 illustrates a DWDM along with a wavelength mapper provided in accordance with a first exemplary embodiment of the invention, with the wavelength mapper provided for automatically determining the transmission wavelengths of the lasers of the DWDM as a function of tuning parameters of the lasers.

FIG. 2 illustrates a DWDM 200 having forty individual WTLs 202 for transmitting optical signals on forty ITU C-band channels via a single optic fiber (not shown). In FIG. 2, an optic fiber output from a selected WTL is connected via a fiber optic line 203 to the input of a wavelength mapper 204 (which may be portable, hand-held, or part of a fixed unit) configured for automatically determining the transmission wavelength of the WTL as a function of WTL tuning parameters, such as a WTL control voltage or current. Output from the wavelength mapper to the selected WTL of DWDM is via a control line 205. Although a forty channel DWDM is shown, in other implementations 80, 160, or more WTLs are provided. Also, other lasers may be employed in the alternative, such as DFB lasers, provided their tuning range is sufficient to record a minimum number of gas absorption lines (>5).

To permit the DWDM to transmit the forty separate ITU channels simultaneously, each individual WTL of the DWDM must be precisely tuned to a single ITU transmission channel wavelength. For an example wherein the WTLs are tuned by applying a control voltage to the WTL, a separate voltage level is associated with each ITU wavelength. The wavelength mapper operates to determine the resulting transmission wavelength for each WTL for values of the control voltage throughout an entire voltage tuning range. This process is performed sequentially for each of the forty WTLs to generate a separate wavelength vs. voltage map for each WTL. Thereafter, any particular WTL can be tuned to any selected transmission wavelength merely by accessing the corresponding wavelength vs. voltage map to determine the appropriate control voltage. Typically, the WTLs are set to selected ITU C-band channels, but can be set to any selected wavelength. Wavelength mapping is performed when a new WTL laser is fabricated and its tuning parameters must be determined, and when an installed WTL must be accurately tuned to another ITU channel in the field by field service personnel.

Figure 3:
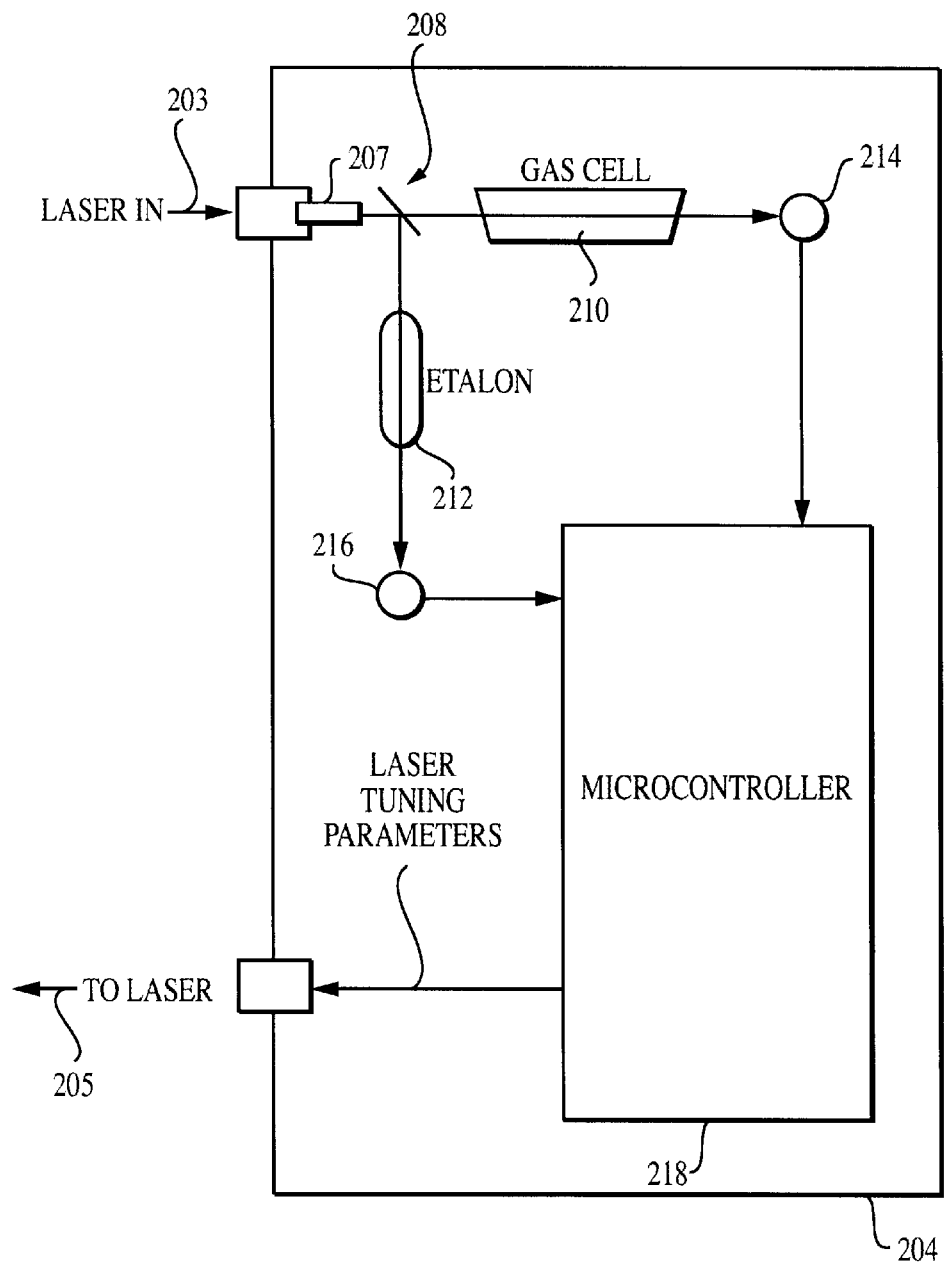
FIG. 3 illustrates the wavelength mapper of FIG. 2.

FIG. 3 illustrates pertinent internal components of wavelength mapper 204. The wavelength mapper receives an input optical beam from one of the WTLs of the DWDM (FIG. 2) via optic fiber 20. The input beam is collimated using a collimator 207 then split using a splitter 208, with one portion of the beam being routed through a gas cell 210 and another portion being routed through an etalon 212. The gas cell contains gas having a known absorption spectrum with numerous absorption lines in the optical bandwidth in which the laser is to be tuned. For a laser to be tuned within the ITU C- and S-bands, acetylene is appropriate, with carbon dioxide being suitable for the L-band. The etalon is configured to provide numerous transmission lines within the optical bandwidth in which the laser is to be tuned. The etalon, as with all etalons, provides transmission lines (or fringe peaks) equally spaced in terms of wavenumbers. (A wavenumber is 10,000/(wavelength in microns) and thereby can easily be converted to wavelength or frequency). For use with a forty channel ITU C-band DWDM, the etalon is preferably configured to provide at least five hundred transmission peaks in the C-band.

A first optical detector 214 detects a beam emergent from the gas cell and a second optical detector 216 detects a beam emergent from the etalon. Signals detected by the detectors are routed into a microcontroller 218 for processing therein. The microcontroller is also connected to the DWDM via control line 205 to control the selected WTL of the DWDM to scan through the entire ITU C-band. In other words, the microcontroller varies the voltage or current input to the WTL throughout an entire input range to thereby vary the transmission wavelength of the WTL throughout the entire ITU C-band. As a result, the two optical detectors both receive an entire spectrum of optical signals covering the entire ITU C-band. The detector coupled to the etalon detects an etalon spectrum having etalon transmission lines therein. The detector coupled to the gas cell detects a gas absorption spectrum having gas absorption lines therein. The microcontroller also inputs a reference gas absorption spectrum for the gas contained within the gas cell wherein the reference absorption spectrum specifies the absolute wavenumber, wavelength or frequency for each of the absorption lines of the gas. The microcontroller processes the detected etalon and gas absorption spectra in combination with the reference gas spectrum to determine the transmission wavelengths of the WTL as a function of the voltage or current tuning parameter applied to the WTL to thereby map the wavelengths of the WTL. The wavelength map is stored for subsequent use in setting the WTL to transmit at any selected wavelength, such as at one of the ITU C-band channels.

Figure 5:
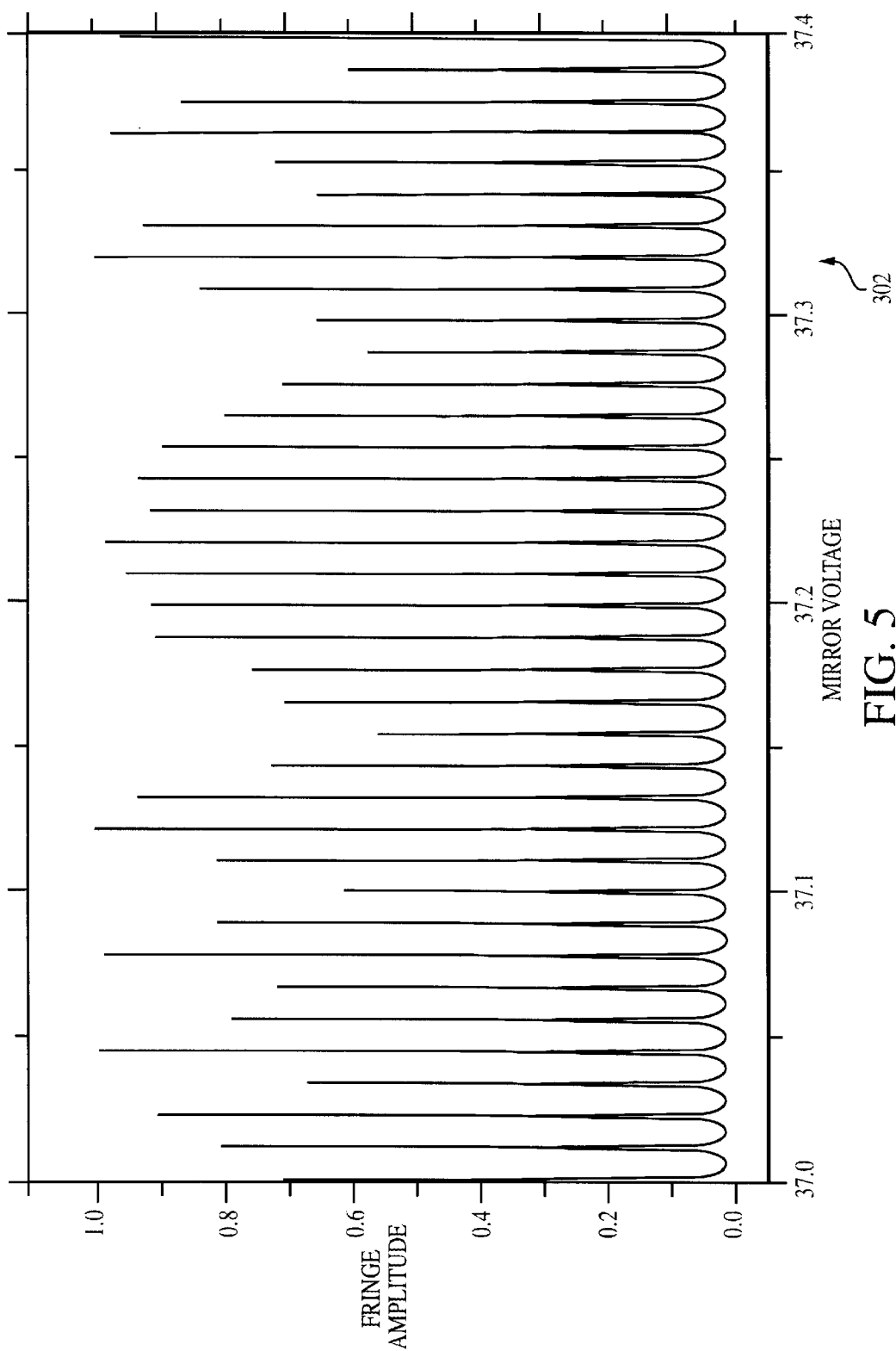
FIG. 5 illustrates an exemplary etalon transmission spectrum detected by the method of FIG. 4, scaled as a function of a laser voltage tuning parameter.
Figure 6:
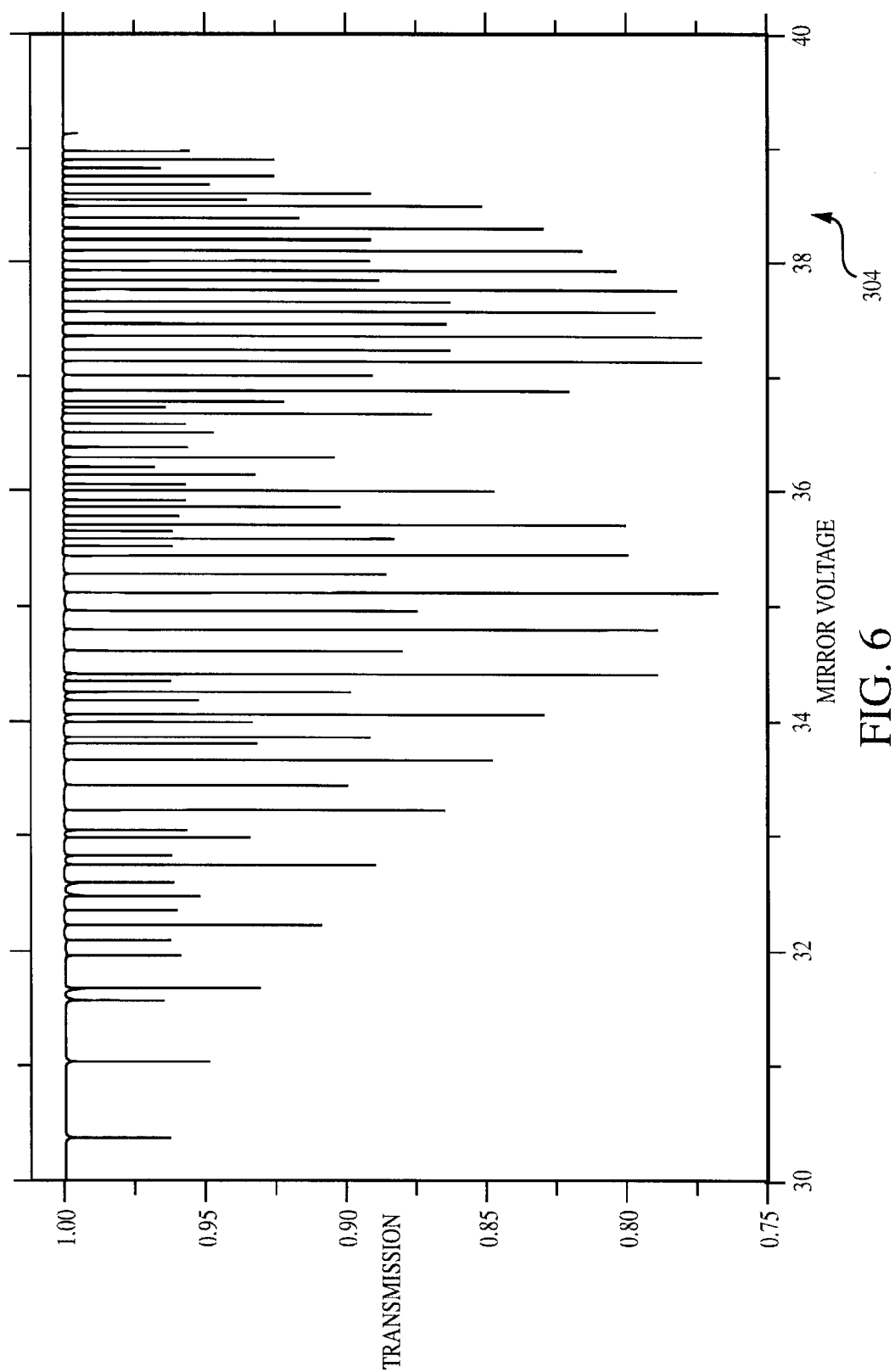
FIG. 6 illustrates an exemplary gas absorption spectrum detected by the method of FIG. 4, also scaled as a function of the laser voltage tuning parameter.

The manner by which the wavelength mapper generates a wavelength vs. tuning parameter map for a WTL or other laser will now be described in greater detail with reference to FIGS. 4–7. Initially, at step 300 of FIG. 4, the wavelength mapper routes an output beam of the laser through the etalon and through the gas cell while tuning the laser through a complete range of tuning parameters to generate an etalon transmission spectrum and gas absorption spectrum. In one specific example, for a laser tuned by a control voltage ranging from 0.0 to 40.0 volts, the wavelength mapper incrementally increases the voltage from 0.0 to 40.0 volts by voltage increments of 0.0000610352 volts to generate etalon and gas absorption spectra each with 65536 data points. The etalon and gas absorption spectra are detected at step 306 and stored in separate data arrays by the wavelength mapper. A section of an exemplary etalon spectrum 302 for an etalon having a peak spacing of about 6.6 gigahertz (GHz) is shown in FIG. 5. Preferably, however, an etalon with a peak spacing of 8 GHz is used. A section of an exemplary gas absorption spectrum 304 for acetylene is shown in FIG. 6. Both spectra are scaled by voltage. For each data point, the wavelength mapper also stores the corresponding data point number in a data array. Hence, the detected etalon and gas absorption spectra are both recorded as functions of voltage, not wavelength or frequency which is as yet unknown.

Figure 4:
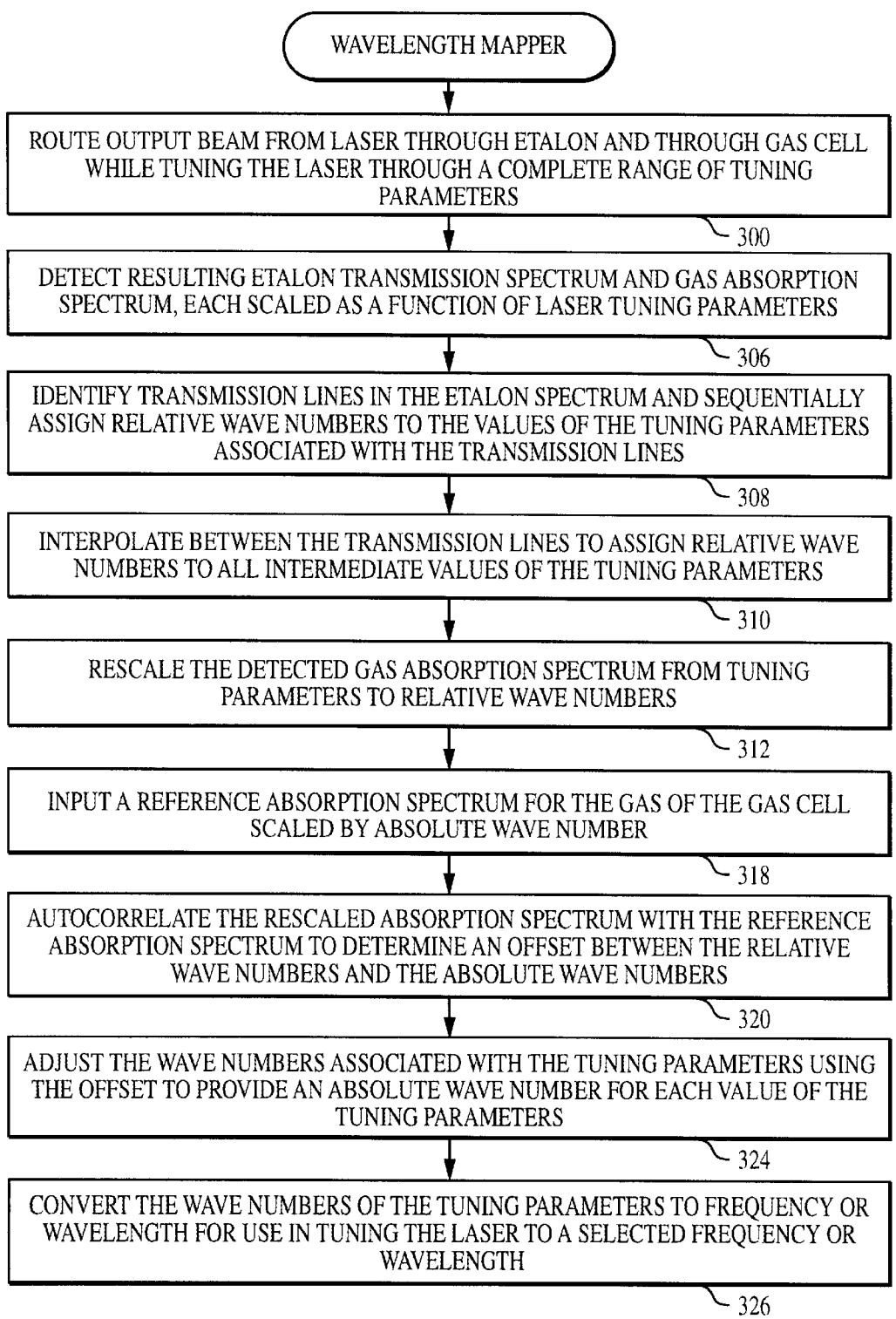
FIG. 4 illustrates a method performed by the wavelength mapper of FIG. 3.

Continuing with FIG. 4, the wavelength mapper then processes the detected etalon spectrum at step 308 to identify and locate transmission peaks therein. The peaks are located by determining first and second derivatives of the etalon spectrum as a function of data point and by applying polynomial fitting in the local peak areas in accordance with conventional techniques. The location of each peak is specified by its corresponding fractional data point number. Note that the peaks are not equally spaced in terms of the data points. Rather, the peaks are generally non-linearly distributed among the data points. In any case, once the peaks are identified and located, the wavelength mapper sequentially assigns relative wavenumbers to each of the transmission peaks beginning with 1 and proceeding to the last detected peak. In the example of FIG. 5 (which shows only a very small section of the etalon spectrum), there are 37 peaks and hence the peaks may be numbered from e.g. 400 to 437. The relative wavenumbers generated by this process are stored in the etalon spectrum data array at the fractional data point corresponding to the voltage peak, and interpolated to the integer point numbers surrounding the peak. For example, if the 403rd transmission peak is found at data point 50788.56 out of the 65536 data points, then relative wavenumber 403 is assigned to fractional data point 50788.56. Relative wavenumbers for integer data points 50788 and 50789 are obtained by interpolation and stored in the etalon data array. Similarly, if the 404th transmission peak is found at data point 50823.17 out of the 65536 data points, then relative wavenumbers 404 is stored in association with fractional data point 50823.17. Fractional relative wavenumbers for the adjacent integer points 50823 and 50824 are assigned by interpolation. The relative wavenumbers can be assigned to the transmission peaks of the etalon spectrum sequentially because the peaks are generated by an optical etalon which, by virtue of its optical properties, produces peaks substantially equally spaced in wavenumber. Hence, even though the peaks are not equally spaced as a function of the data points or as a function of laser input voltage, the peaks are nevertheless equally spaced as a function of relative wavenumber, and sequential wavenumbers can be reliably assigned. The wavenumbers are referred to herein as relative wavenumbers because the absolute wavenumber (and hence the absolute wavelength or wavelength) is not yet known.

Thus, upon completion of step 308, relative wavenumbers have been assigned only to those integer data points in the etalon spectrum array that correspond to the closest etalon transmission peak. At step 310, the wavelength mapper interpolates between the peaks to assign fractional wavenumbers to each intermediate data point. For the example wherein the relative wavenumber 403 falls between data points 50788 and 50789, and relative wavenumber 404 falls between integer data points 50823 and 50824, the wavelength mapper interpolates between the assigned fractional wavenumbers to data points 50789 through 50822. In one specific example, as a result of the interpolation, data point 50789 may be assigned a relative wavenumber of 6471.5600; data point 50790 may be assigned a relative wavenumber of 6471.5625; and so on. In this manner, interpolation is preformed to assign fractional relative wavenumbers to each remaining value in the etalon spectrum data array. Note that the fractional wavenumbers are not necessarily evenly distributed between integer wavenumbers. Rather, as a result of the interpolation, the fractional wavenumbers may be assigned non-linearly. Thus following interpolation, each integer data point of the etalon array has a relative wavenumber associated therewith. The relative wavenumbers are stored along with the corresponding voltage values in the etalon spectrum data array to thereby provide a relative wavenumber for each data point.

At step 312, the relative wavenumbers generated for each data point of the etalon array are used to re-scale the gas spectrum data array. To this end, the relative wavenumber of each data point of the etalon spectrum array is assigned to the corresponding data point of the detected gas absorption spectrum array. At this point a relative wavenumber scale exists both for the etalon transmission spectrum and the gas absorption spectrum. However, the relative wavenumber scale is not linear because of the non-linear tuning properties of the laser.

Figure 7:
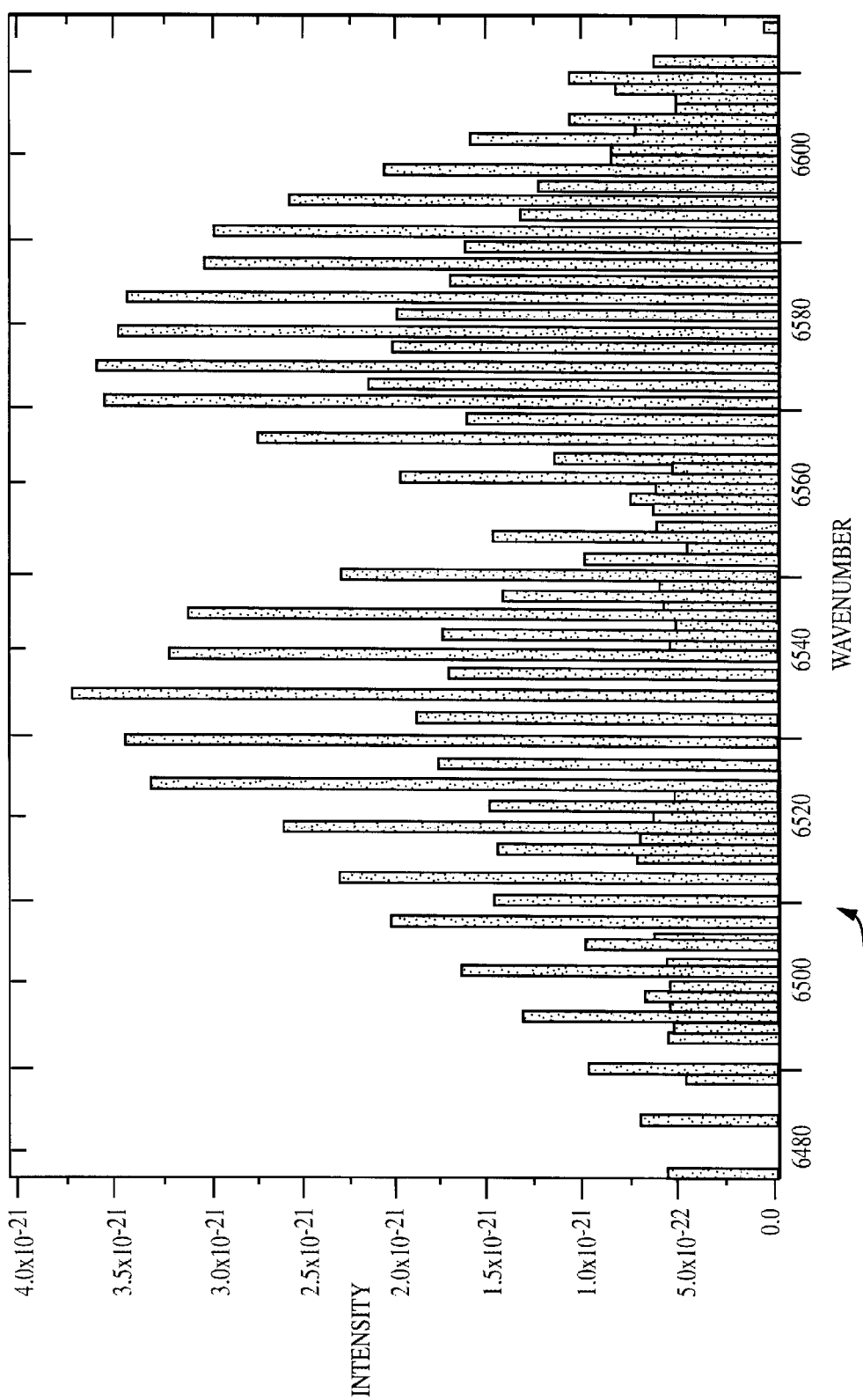
FIG. 7 illustrates an input reference gas absorption spectrum.

At step 318, the wavelength mapper inputs a reference gas absorption intensity spectrum for the gas of the gas cell, wherein the reference spectrum is scaled according to absolute wavenumber, rather than relative wavenumber. FIG. 7 illustrates a portion of an exemplary reference gas intensity spectrum 322 for acetylene. This spectrum is generated synthetically using the know frequencies and intensities of the reference gas, which are known to high accuracy through published laboratory measurements and verification by the National Institute of Standards and Technology (NIST). The reference spectrum is input as a data array of equal size to the modified gas absorption data array, e.g. 65536 data points. At step 320, the wavelength mapper autocorrelates the intensity pattern of the modified detected gas absorption spectrum, which is a function of relative wavenumber, with the intensity pattern of the input reference spectrum, which is a function of absolute wavenumber, to determine any offset therebetween. An appropriate autocorrelation technique, modified as needed, may be found in "Correlation-based Technique for Automated Tunable Diode Laser Scan Stabilization", Randy May, *Rev. Sci. Instrum.* 63 (5), May 1992. As a second iteration of the process, the etalon transmission peak spacing (the etalon "free spectral range", or FSR) is more precisely determined from the known gas spectrum line positions, and the wavenumber mapping process is repeated to improve accuracy.

Thus, following step 318, the wavelength mapper stores the modified detected gas intensity spectrum generated at step 312 and the reference gas intensity spectrum input at step 318. The two spectra are similar but are offset from one another. Alternatively, at step 320, autocorrelation may be performed to determine the shift of the spectra with respect to one another until the spectra are aligned, thus permitting the amount of shift or offset to be determined. The offset represents the offset between the relative wavenumbers and their corresponding absolute wavenumbers. At step 324, the relative wavenumbers of the various arrays are adjusted using the offset to convert the relative wavenumbers to absolute wavenumbers. Once the absolute wavenumbers are known, an absolute wavelength or frequency is assigned at step 326 to each of the control voltage values stored in the etalon spectrum array.

Although the wavelength mapper has been described with respect to an exemplary embodiment wherein the laser is controlled by a single voltage control signal, in general, any laser can be used with the invention so long as an appropriate gas absorption reference is available and the laser is tunable via a set of input tuning parameters, such as various combinations of input analog or digital signals. The laser is simply scanned through its full range of tuning parameters to enable determination of the absolute output wavelength of the laser as a function of any combination of the tuning parameters. The resulting wavelength vs. tuning parameters map is therefore a multi-dimensional map having a unique wavelength for each combination of tuning parameters. For some lasers tunable with two parameters, it may be sufficient to set a first tuning parameter to a single constant value while varying a second tuning parameter, then set the second tuning parameter to a single constant value while varying the first tuning parameter. In other cases, it may be necessary to tune the laser through every possible combination of the two parameters to account for non-linear effects. For any given laser, routine experimentation can be performed to determine the specific manner with which the tuning parameters are to be varied.

Figure 8:
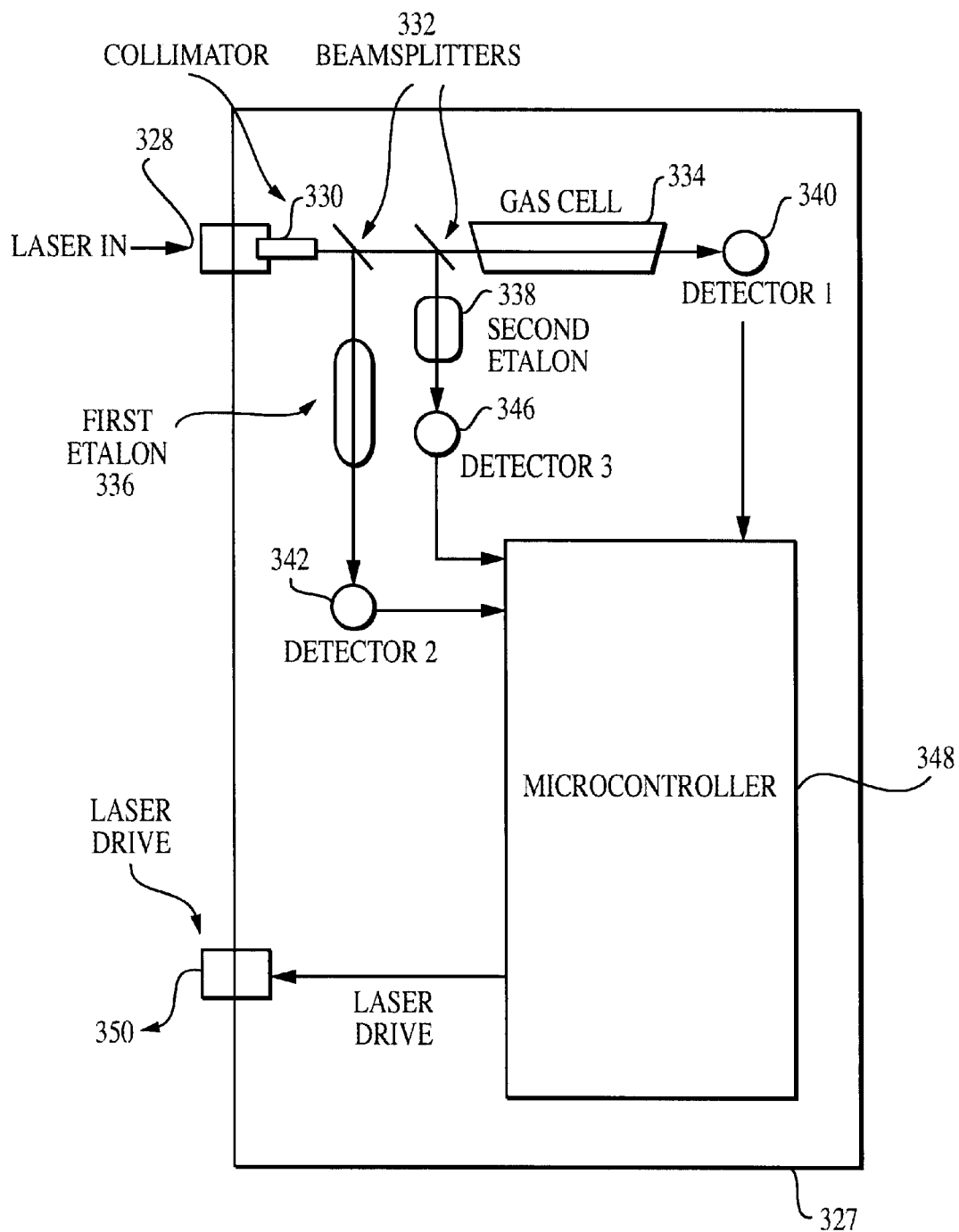
FIG. 8 illustrates a wavelength mapper for use with lasers with multiple tuning parameters.

FIG. 8 illustrates pertinent internal components of a wavelength mapper 327 for use with lasers with multiple tuning parameters such as multi-section Discrete Bragg Reflector (DBR) lasers, Grating-assisted codirectional Coupler with rear Sampled Reflector (GCSR) laser or the widely tunable laser described in U.S. patent application Ser. No. 09/753,285 to Kszendzov, et al., entitled "Tunable Semiconductor Laser Having Cavity with Ring Resonator Mirror and Mach-Zehnder Interferometer", filed Jan. 2, 2001, which is hereby fully incorporated by reference. In the specific example of FIG. 8, it will be assumed that the wavelength mapper is used in combination with a GCSR having three tuning parameters: a course-tuning coupler current, a course-tuning reflector current, and a fine-tuning phase current.

Briefly, the wavelength mapper of FIG. 8 uses a pair of etalons—one comparatively thick and one comparatively thin. The thin etalon produces a fairly coarse relative wavelength map covering an entire transmission band of interest as a function of the coarse-tuning coupler current and reflector current tuning parameters. The thick etalon is then employed to produce a fairly fine relative wavelength map within particular portions of the transmission band of interest as a function of the fine-tuning phase current. The fine relative wavelength map is compared with a relative spectrum derived from a gas absorption cell and an absolute reference spectrum using the techniques above to map the tuning parameters to absolute transmission wavelengths of the lasers. In this manner, wavelength mapping is achieved for use with lasers requiring multiple tuning parameters in circumstances where a single etalon might not cover the entire transmission band of interest with sufficient precision.

Now considering the wavelength mapper of FIG. 8 in detail, Wavelength mapper 327 is configured to receive an input optical beam from a laser (not shown) via optic fiber 328. The input beam is collimated using a collimator 330 then split using splitters 332, with one portion of the beam being routed through a gas cell 334, one portion of the beam being routed through a first etalon 336, and one other portion of the beam being routed through a second etalon 338. First etalon 336 is a relatively thick etalon providing finely spaced transmission lines. Second etalon 338 is a relatively thin etalon providing coarsely spaced transmission lines. For use with a forty channel ITU C-band DWDM, the thick etalon 336 is preferably configured to provide at least five hundred transmission peaks in the C-band and the thin etalon 338 is preferably configured to provide at least 2–3 transmission peaks in the C-band. The gas cell contains gas having a known absorption spectrum with numerous absorption lines in the optical bandwidth in which the laser is to be tuned such as those described above.

A first optical detector 340 detects a beam emergent from the gas cell, a second optical detector 342 detects a beam emergent from the thick etalon, and a third optical detector 346 detects a beam emergent from the thin etalon. Signals detected by the detectors are routed into a microcontroller 348 for processing therein. The microcontroller is also connected to the DWDM via control line 350 to control the tuning parameters of the laser within the DWDM to scan through the entire ITU C-band.

In operation, the microcontroller 348 varies the coupler current input to the GCSR throughout its full tuning range, while keeping the other tuning parameters at a fixed value, such as zero. The beam routed through the thin etalon 338 is detected by the detector 346 to produce a first coarse etalon transmission spectrum, which is a function of coupler current. Because etalon 336 is fairly thin (preferably having a FSR of 2500 GHz), the spacing of the etalon peaks is fairly wide, with perhaps only 2–3 peaks within the spectrum. Next, the microcontroller varies the reflector current input to the GSCR throughout its full tuning range, while keeping the other tuning parameters at a fixed value. The beam routed through the thin etalon 338 is again detected by detector 346 to produce a second coarse etalon transmission spectrum, which is a function of reflector current. Again, because etalon 336 is fairly thin (preferably having an FSR of 2500 GHz for a thick etalon having an FSR of 8 GHZ), the spacing of the etalon peaks is fairly wide.

Figure 9:
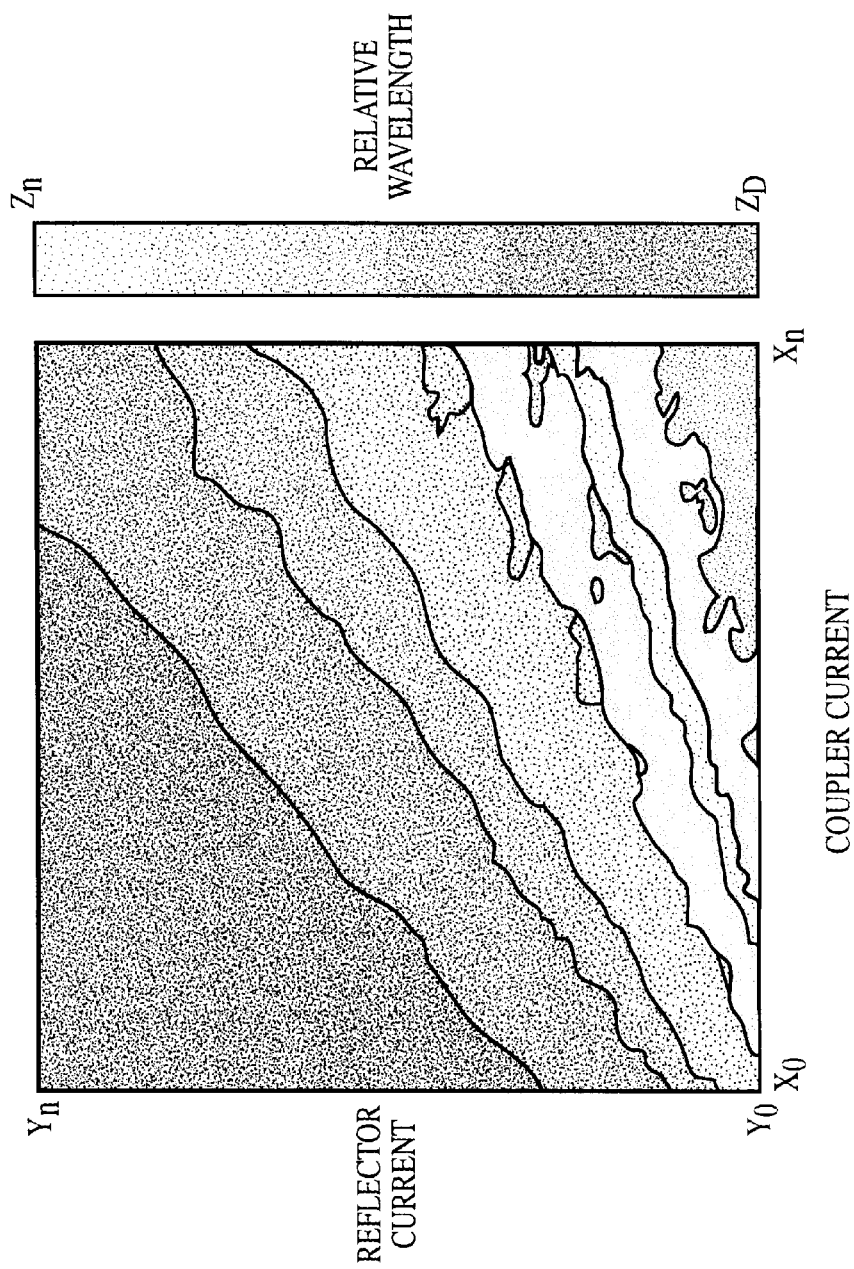
FIG. 9 illustrates an exemplary relative wavelength map produced by the wavelength mapper of FIG. 8.

The microcontroller processes the two coarse etalon spectra to assign relative wavenumbers to the transmission peaks found therein and then to convert the relative wavenumbers to relative wavelengths. As noted above, relative wave numbers can be derived from an etalon spectrum by counting the etalon transmission peaks, which are equally spaced in wave number. Then, the microcontroller, create a two-dimensional coarse relative wavelength map, such as the one illustrated in FIG. 9, by combining the two etalon spectra. The two-dimensional map provides relative wavelength as a function of the coupler current along a first axis and the reflector current along a second axis. In FIG. 9, the relative wavelength (which is a z-axis) is shown using gradients.

Next, the microcontroller analyzes the two-dimensional map to determine a sequence of coarse tuning parameters needed to vary the output wavelength of the laser from its minimum wavelength to its maximum wavelength in a generally linear fashion. To this end, the microcontroller first finds the lowest point on the two-dimensional map, which represents the shortest (or minimum) wavelength of the laser, then determines the combination of tuning parameters corresponding to that point on the map and stores that combination in memory. Then, the microcontroller finds the next lowest point on the two-dimensional map, which represents the next shortest wavelength, then determines the combination of tuning parameters corresponding to that point on the map and stores that combination in memory. The microcontroller continues this process until it has found the highest point on the map, which represents the longest (or maximum) wavelength of the laser. Thus, with this process, the microcontroller derives a sequence of combinations of the coupler and reflector tuning parameters needed to vary the output of the laser from its minimum wavelength to its maximum wavelength in fairly coarse, but monotonic steps.

Next, the microcontroller controls the laser to step through its output wavelengths from minimum wavelength to maximum wavelength by sequentially applying the stored combinations of coupler and reflector tuning parameters. For each combination of coupler and reflector tuning parameters, the microcontroller holds those parameters constant while adjusting the phase tuning parameter to thereby finely tune the laser around the wavelength provided by combination of coupler and reflector tuning parameters. In this manner, the laser is controlled to vary its output wavelength from minimum to maximum while covering most or all individual wavelengths between the minimum to maximum. While the laser is controlled in this manner, its output beam is routed through the thick etalon 336 and through the gas absorption cell 334 to generate a third etalon spectrum having finely spaced transmission peaks and to produce a gas absorption spectrum. The third etalon spectrum and gas absorption spectrum are both functions of all three tuning parameters.

Using the techniques described above in connection with FIG. 4, the microcontroller processes the third etalon spectrum and the relative gas absorption spectrum in combination with a reference gas absorption spectrum to determine absolute transmission wavelengths for each combination of the three tuning parameters of the GSCR. In other words, the microcontroller derives a map of absolute transmission wavelengths as a combination of tuning parameters. This final wavelength map is stored for subsequent use in setting the laser to transmit at any selected wavelength, such as at one of the ITU C-band channels.

In the example just described, it is sufficient to hold one of the coarse tuning parameters constant while varying the others. In other cases, it may be necessary to tune the laser through every possible combination of the two coarse tuning parameters to account for non-characterizable effects. For example, a first coarse tuning parameter may be ramped through its entire range while keeping the other coarse tuning parameter constant. The second coarse tuning parameter is then be ramped through its entire range by a set of discrete points, at each point, the first coarse tuning parameter is varied through its the entire range. The resulting wavelength map can then be use to step the laser through its relative wavelengths. Also, note the technique of FIG. 8 can also be applied to lasers employing two tuning parameters (rather than three) by using the thin etalon to derive a one-dimensional coarse map using one of the tuning parameters then using the thick etalon to derive a fine-tuning map using the other tuning parameter. The technique can also be applied by using three or more etalons of differing thickness to provide tuning maps of differing precision for different combinations of the tuning parameters.

What has been described thus far is a wavelength mapper which operates to generate a map of wavelength vs. tuning parameters for a laser, particularly one in a DWDM. In the following, a wavelength locker is described which automatically sets the laser to a selected wavelength by using a wavelength map, and then locks the laser wavelength using an etalon transmission peak that has been temperature or voltage tuned to the selected ITU channel. As many of the features of the wavelength locker are the same as the wavelength mapper described above, only pertinent differences will be described in detail.

Figure 10:
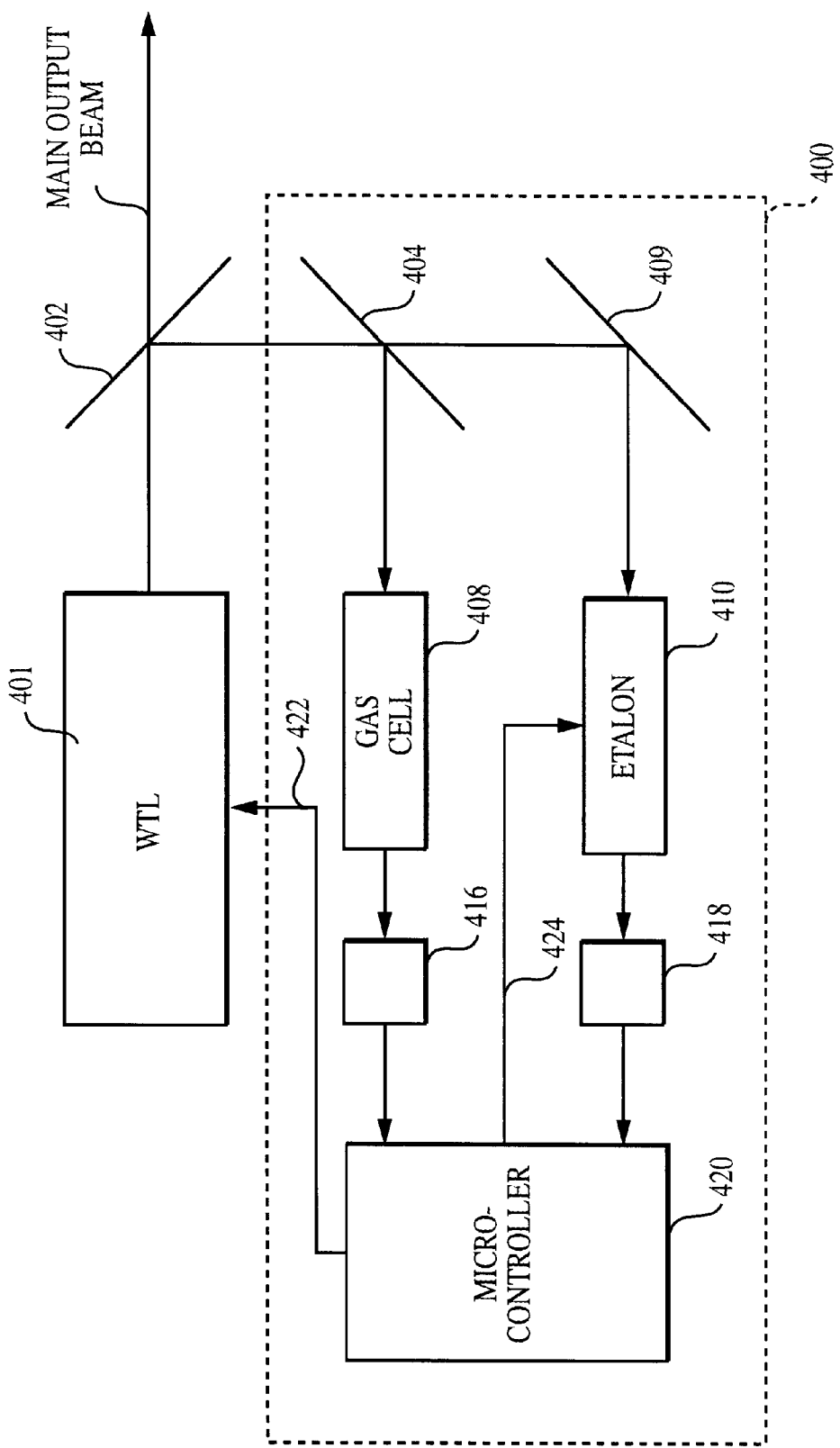
FIG. 10 illustrates an individual DWDM laser along with a wavelength locker provided in accordance with a second exemplary embodiment of the invention, with the wavelength locker provided for automatically determining the transmission wavelengths of the laser and for locking the wavelength of the laser to a selected ITU transmission wavelength by using a voltage-controlled etalon in a feedback loop.

FIG. 10 illustrates pertinent internal components of a wavelength locker 400 for use with a WTL 401. The wavelength locker receives the output from WTL 401 via an optical fiber splitter 402. The laser beam input to the wavelength locker is initially of unknown wavelength. Inside the wavelength locker, a second splitter 404 splits the beam in two with one portion routed through a gas cell 408 and the other portion reflected from a mirror 409 and then routed through an etalon 410. Separate detectors 416 and 418 record the transmission spectra of the gas cell and the etalon as with the wavelength mapper. A microcontroller 420 varies control parameters input to the WTL along a control line 422 to generate a spectrum having both etalon transmission peaks and gas absorption lines. The recorded spectra are fed into the microcontroller for processing to generate a wavelength vs. WTL tuning parameter map using the techniques described above. Once the wavelength vs. WTL tuning parameter map has been generated, the microcontroller looks up the WTL tuning parameter corresponding to a selected wavelength, such as an ITU channel wavelength, then applies the WTL tuning parameter along control signal along line 422 to tune the WTL to the selected transmission wavelength. Additionally, the microcontroller adjusts a temperature control set point to the etalon via a control line 424 to vary the wavelengths of the transmission peaks of the etalon until one of the transmission peaks, as detected by detector 416, is precisely aligned with the selected output wavelength. The microcontroller then locks the output wavelength of the WTL to the selected wavelength by monitoring the etalon transmission peak that is aligned with the selected wavelength. To this end, the micro-controller detects any drift of the WTL relative to the etalon transmission line as detected by detector 418 and adjusts the tuning parameters applied to the WTL via control line 422 to compensate for the drift. In other words, a negative feedback loop is provided which keeps the main output beam locked on a selected etalon transmission channel despite possible variations in the output characteristics of the WTL.

Alternatively, gas cell 408 and etalon 410 are integrated into as single device or are provided along a common optical path with a single detector to detect the etalon and the gas absorption spectra simultaneously. Although the resulting spectra has both etalon peaks and gas absorption lines, the etalon peaks and the gas absorption lines do not significantly interfere with one another and hence the wavelength mapping process performed above can be performed. In this regard, the etalon peaks represent about 30% changes in transmission, whereas the gas lines represent only about 1% using second harmonic detection. Thus, the gas lines represent a very small perturbation to the etalon spectrum and do not interfere with the etalon wavenumber locking procedure, but are strong enough to permit the autocorrelation procedure without significant errors.

Figure 11:
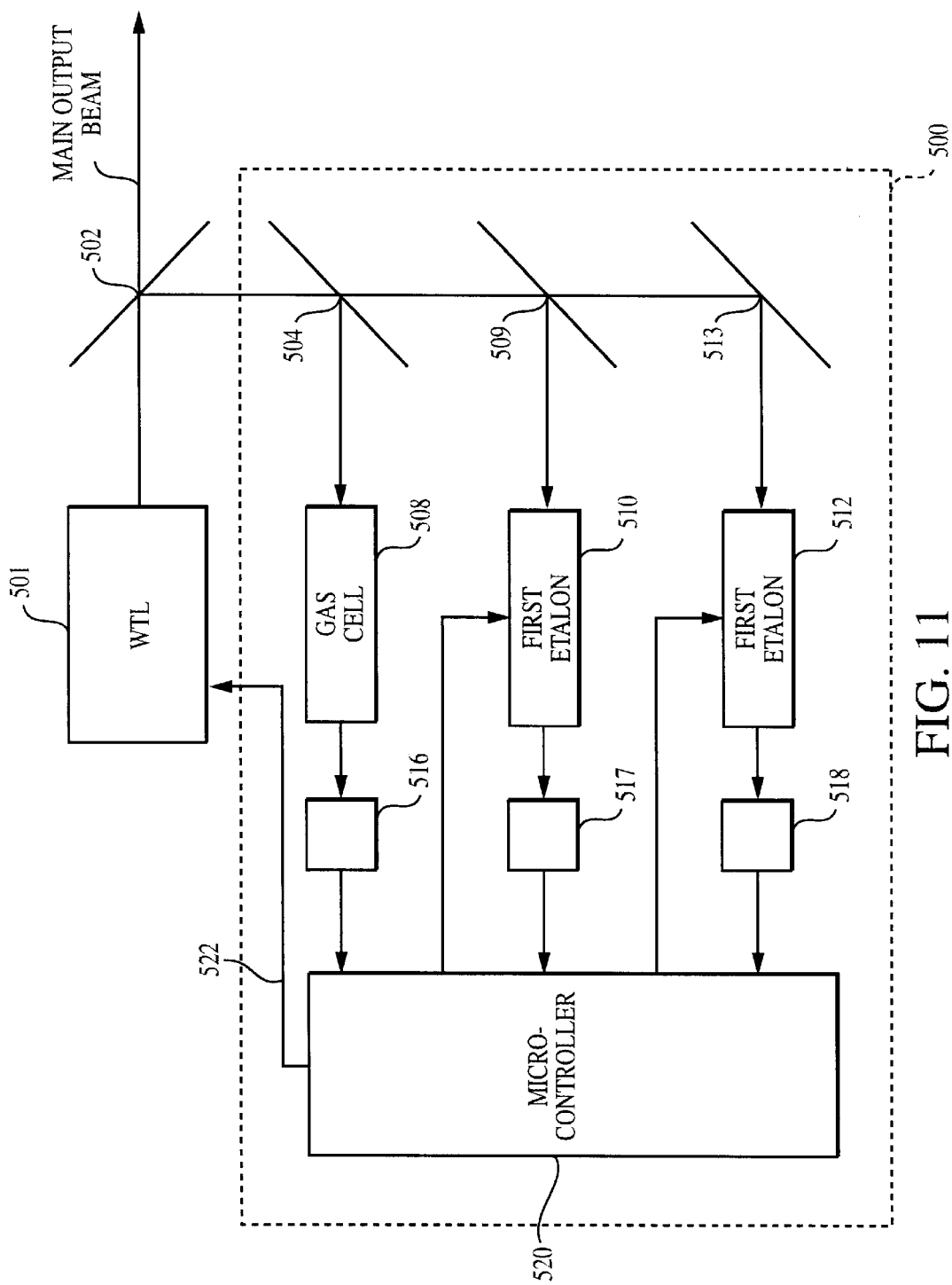
FIG. 11 illustrates a second exemplary wavelength locker for use with lasers with multiple tuning parameters.

FIG. 11 illustrates pertinent internal components of a wavelength locker 500 for use with a WTL 501. The wavelength locker receives the output from WTL 501 via an optical fiber splitter 502. The laser beam input to the wavelength locker is initially of unknown wavelength. Inside the wavelength locker, a first splitter 504 splits the beam in two with one portion routed through a gas cell 508 and the other portion routed through a second splitter 509, which then routes the beam into a first etalon 510, and a second etalon 512 via a mirror 513. Detectors 516, 517, and 518 record the transmission spectra of the gas cell and the etalons as with the wavelength mapper for use with lasers with multiple tuning parameters described above. A microcontroller 520 varies control parameters input to the WTL along a control line 522 to generate spectra having both etalon transmission peaks and gas absorption lines. The recorded spectra are fed into the microcontroller for processing to generate a wavelength vs. WTL tuning parameter map using the techniques described above. Once the wavelength vs. WTL tuning parameter map has been generated, the microcontroller looks up the WTL tuning parameter corresponding to a selected wavelength, such as an ITU channel wavelength, then applies the WTL tuning parameter along control signal along the control line to tune the WTL to the selected transmission wavelength. Additionally, the microcontroller adjusts the alignment of the etalon transmission peaks via the control line to vary the wavelengths of the transmission peaks of the etalon until one of the transmission peaks, as detected by detector 516, is precisely aligned with the selected output wavelength. For further exemplary tuning techniques, see U.S. patent application Ser. No. 09/811,087 "Method and System for Locking Transmission Wavelengths for Lasers in a Dense Wavelength Division Multiplexer Using a Tunable Etalon" to Randy May, filed Mar. 17, 2001, which is herein fully incorporated by reference. The microcontroller then locks the output wavelength of the WTL to the selected wavelength by monitoring the etalon transmission peak that is aligned with the selected wavelength. To this end, the micro-controller detects any drift of the WTL relative to the etalon transmission line as detected by first etalon detector 517 and adjusts the tuning parameters applied to the WTL via the control line to compensate for the drift. In effect, a negative feedback loop is provided which keeps the main output beam locked on a selected etalon transmission channel despite possible variations in the output characteristics of the WTL.

The exemplary embodiments have been primarily described with reference to block diagrams illustrating pertinent components of the embodiments. It should be appreciated that not all components of a complete implementation of a practical system are necessarily illustrated or described in detail. In addition, one of ordinary skill in the art will understand that the steps in the above disclosed methods may b e practiced in various sequences without departing from the spirit of the invention. Rather, only those components necessary for a thorough understanding of the invention have been illustrated and described in detail. Actual implementations may contain more components or, depending upon the implementation, fewer components.

The description of the exemplary embodiments is provided to enable any person skilled in the art to make or use the invention. The invention is not intended to be limited to the embodiments shown herein but is to be accorded the widest scope consistent with the principles and novel features disclosed herein. For example, one of ordinary skill in the art will appreciate that the current invention may be used for the calibration of wavelength demultiplexers at the receiving end of DWDM systems as well as for all applications using tunable photonics equipment (i.e., add/drop filters, provisioning to increase bandwidth). Consequently, the scope of the present invention should not be limited by the particular embodiments discussed above, but should be defined only by the claims set forth below and equivalents thereof.

What is claimed is:

1. A method for calibrating a laser with multiple tuning parameters using a first etalon, a second etalon, and a gas absorption cell containing a gas of known light absorption characteristics, with the second etalon providing more closely-spaced transmission peaks as a function of wavelength than the first etalon, the method comprising the steps of:

routing an output beam from the laser through the first etalon while tuning the laser through a range of a first tuning parameter to produce a first relatively coarse etalon transmission spectrum, the first etalon spectrum being a function of the first laser tuning parameter;

routing the output beam from the laser through the first etalon while tuning the laser through a range of a second tuning parameter to produce a second relatively coarse etalon transmission spectrum, the second etalon spectrum being a function of the second laser tuning parameter;

deriving a relative wavelength map based on the first and second relatively coarse etalon transmission spectra;

processing the relative wavelength map to determine a sequence of combinations of the first and second tuning parameters for use in varying the wavelength of the laser throughout a range of output wavelengths;

routing the output beam from the laser through the second etalon and through the gas cell while tuning the laser through a range of relative wavelengths using the sequence of combinations of the first and second tuning parameters to produce a relatively fine etalon transmission spectrum as a function of the laser tuning parameters and a gas absorption spectrum as a function of the laser tuning parameters; and comparing the detected relatively fine etalon transmission spectrum with the detected gas absorption spectrum to determine the absolute transmission wavelength of the laser as a function of the laser tuning parameters.

2. A system for calibrating a laser with multiple tuning parameters comprising:

a first etalon;

a second etalon, with the second etalon providing more closely-spaced transmission peaks as a function of wavelength than the first etalon;

a gas absorption cell containing a gas of known light absorption characteristics;

means for routing an output beam from the laser through the first etalon while tuning the laser through a range of a first tuning parameter to produce a first relatively coarse etalon transmission spectrum, the first etalon spectrum being a function of the first laser tuning parameter;

means for routing the output beam from the laser through the first etalon while tuning the laser through a range of a second tuning parameter to produce a second relatively coarse etalon transmission spectrum, the second etalon spectrum being a function of the second laser tuning parameter;

means for deriving a relative wavelength map based on the first and second relatively coarse etalon transmission spectra;

means for processing the relative wavelength map to determine a sequence of combinations of the first and second tuning parameters for use in varying the wavelength of the laser throughout a range of output wavelengths;

routing the output beam from the laser through the second etalon and through the gas cell while tuning the laser through a range of relative wavelengths using the sequence of combinations of the first and second tuning parameters to produce a relatively fine etalon transmission spectrum as a function of the laser tuning parameters and a gas absorption spectrum as a function of the laser tuning parameters; and means for comparing the detected relatively fine etalon transmission spectrum with the detected gas absorption spectrum to determine the absolute transmission wavelength of the laser as a function of the laser tuning parameters.

* * * * *

UNITED STATES PATENT AND TRADEMARK OFFICE
CERTIFICATE OF CORRECTION

PATENT NO. : 6,567,433 B2
DATED : August 1, 2003
INVENTOR(S) : Randy Dean May

It is certified that error appears in the above-identified patent and that said Letters Patent is hereby corrected as shown below:

<u>Title page,</u>
Item [73], Assignee, please replace "Tunable Photonics Corporation" with
-- SpectraSensors, Inc. --.
Item [74], *Attorney, Agent, or Firm*, please replace "Welsh & Katz, Ltd." with
-- Carl A. Kukkonen, III --.

Signed and Sealed this

Twenty-first Day of October, 2003

JAMES E. ROGAN
*Director of the United States Patent and Trademark Office*